United States Patent [19]

Petrovic et al.

[11] Patent Number: 5,109,532
[45] Date of Patent: Apr. 28, 1992

[54] ELIMINATION OF PHASE NOISE AND DRIFT INCIDENT TO UP AND DOWN CONVERSION IN A BROADCAST COMMUNICATION SYSTEM

[75] Inventors: Branislav A. Petrovic, La Jolla; William Fong, San Diego, both of Calif.

[73] Assignee: General Instrument Corporation, Chicago, Ill.

[21] Appl. No.: 472,597

[22] Filed: Jan. 30, 1990

[51] Int. Cl.⁵ ............. H04B 1/00; H04B 15/06
[52] U.S. Cl. ..................... 455/63; 455/310; 455/317; 329/319
[58] Field of Search ........... 455/63, 70, 296, 310, 455/316, 317, 260, 237; 375/97; 329/319, 325

[56] References Cited

U.S. PATENT DOCUMENTS

| | | | |
|---|---|---|---|
| 3,553,579 | 1/1971 | Teixeira | 324/83 |
| 3,962,635 | 6/1976 | Roza | 325/13 |
| 4,027,250 | 5/1977 | Lang | 325/323 |
| 4,144,579 | 3/1979 | Nossen et al. | 364/607 |
| 4,195,203 | 4/1980 | Sakai et al. | 179/1 GD |
| 4,268,793 | 5/1981 | Amazawa et al. | 328/165 |
| 4,306,307 | 12/1981 | Levy et al. | 375/15 |
| 4,313,219 | 1/1982 | Gabler et al. | 375/97 |
| 4,317,958 | 3/1982 | Hamagachi et al. | 179/1 G |
| 4,336,505 | 6/1982 | Meyer | 331/1 R |
| 4,394,626 | 7/1983 | Kurihara et al. | 331/12 |
| 4,410,954 | 10/1983 | Wheatley | 364/701 |
| 4,472,814 | 9/1984 | Gutleber | 375/34 |
| 4,475,215 | 10/1984 | Gutleber | |
| 4,484,152 | 11/1984 | Lee | 331/1 A |
| 4,514,855 | 4/1985 | Lang et al. | 375/97 |
| 4,519,084 | 5/1985 | Lengseth | 375/14 |
| 4,527,187 | 7/1985 | Ohta | 358/23 |
| 4,536,718 | 8/1985 | Underhill | 331/16 |
| 4,592,071 | 5/1986 | Prigent | 375/42 |
| 4,823,399 | 4/1989 | George | 455/192 |
| 4,918,748 | 4/1990 | Shahriary et al. | 455/317 |
| 4,994,767 | 2/1991 | Hawkis | 455/63 |
| 5,046,137 | 9/1991 | Hatcher | 455/317 |

FOREIGN PATENT DOCUMENTS

WO81/00942 2/1981 World Int. Prop. O. .

Primary Examiner—Reinhard J. Eisenzopf
Assistant Examiner—Lisa Charouel
Attorney, Agent, or Firm—Edward W. Callan

[57] ABSTRACT

Phase noise and drift in a broadcast communication system caused by imperfections in transmitter and receiver local oscillators used for up and down conversion of a frequency or phase modulated information signal is eliminated from a downconverted component that is provided for demodulation by adding a pilot frequency component to the modulated signal for mixing by the local oscillator in the transmitter and by frequency locking the local oscillator in the receiver, so that a signal at a frequency equal to the sum of the intermediate frequency and the pilot frequency provided by a phase-locked loop that tracks the pilot frequency component of the downconverted signal is maintained at a desired value. The downconverted signal is mixed with the sum signal provided by the phase-locked loop to provide a component for demodulation at the difference between the pilot frequency and the modulation frequency that is free from the phase noise and drift caused by the local oscillators. Since the phase noise and drift caused by the local oscillators affects the phases of the modulation frequency information component and the pilot frequency component equally, the frequency modulated information is proportional to the difference between the pilot signal frequency and the modulation frequency, and the effect of phase noise and drift is eliminated.

6 Claims, 1 Drawing Sheet

ELIMINATION OF PHASE NOISE AND DRIFT INCIDENT TO UP AND DOWN CONVERSION IN A BROADCAST COMMUNICATION SYSTEM

BACKGROUND OF THE INVENTION

The present invention generally pertains to broadcast communication systems in which a frequency or phase modulated communication signal is upconverted to a carrier frequency for transmission and downconverted upon reception for demodulation, and is particularly directed to eliminating phase noise and drift that occurs incident to such up and down conversion.

In a typical broadcast communication system, a baseband information signal is frequency or phase modulated at a given modulation frequency and the modulated information signal is mixed with an RF signal at a carrier frequency from a local oscillator in a transmitter to provide an upconverted signal for transmission; and upon reception by a receiver the transmitted signal is mixed with an RF signal from a local oscillator in the receiver to provide a downconverted signal at an intermediate frequency for demodulation by the receiver to provide the information signal at the baseband frequency. Frequency errors inherently present in imperfect local oscillators cause phase noise and drift to be present in the signals provided by the local oscillators. In the prior art such phase noise and drift are reduced by constructing the local oscillators to more rigid specifications to reduce the frequency errors therein. However, such a solution to the phase noise and drift problem significantly increases the cost of the transmitter and receiver without completely eliminating the problem.

SUMMARY OF THE INVENTION

The present invention eliminates phase noise and drift from the component of the downconverted signal in the receiver that is provided for demodulation by adding a pilot frequency component to the frequency or phase modulated signal for mixing by the local oscillator in the transmitter and by phase locking the local oscillator in the receiver to a signal at a frequency equal to the sum of the intermediate frequency and the pilot frequency provided by a phase-locked loop that tracks the pilot frequency component of the downconverted signal. The downconverted signal is mixed with the sum signal provided by the phase locked loop to provide a component for demodulation at the difference between the pilot frequency and the modulation frequency that is free from the phase noise and drift caused by the local oscillators. Since the phase noise and drift caused by the local oscillators affects the phases of the modulation frequency information component and the pilot frequency component equally, frequency modulated information is proportional to the difference between the pilot signal frequency and the modulation frequency, and the effect of phase noise and drift is eliminated. Likewise, phase modulated information is proportional to phase variations in the component at the difference between the pilot frequency and the modulation frequency from which the effect of phase noise and drift has been eliminated.

A communication system according to the present invention comprises transmitter including a modulator for frequency or phase modulating a baseband information signal at a modulation frequency, a first local oscillator for providing a first RF signal at a carrier frequency, and a first mixer for mixing the modulated information signal with the first RF signal to provide an upconverted signal for transmission; and a receiver including a second local oscillator for providing a local RF signal at a frequency equal to the difference between the carrier frequency and an intermediate frequency, a second mixer for mixing the upconverted signal received from the transmitter with the local RF signal to provide a downconverted signal at the intermediate frequency, and a demodulator for demodulating the downconverted signal to provide the information signal at the baseband frequency, wherein the downconverted signal includes phase noise and drift caused by imperfections in said local oscillators; wherein the transmitter further includes means for adding a pilot frequency component to the modulated information signal in the transmitter prior to mixing the modulated information signal with the first RF signal, whereby the upconverted signal and the downconverted signal each includes a pilot frequency component; and wherein the receiver further includes a phase-locked loop for providing a signal at a frequency equal to the sum of the intermediate frequency and the pilot frequency by tracking the pilot frequency component of the downconverted signal; and means for frequency locking the second local oscillator so that the sum signal provided by the phase-locked loop is adjusted to a desired frequency; wherein the phase-locked loop includes a third mixer for mixing said sum signal provided by the phase-locked loop with the downconverted signal to thereby provide a downconverted component for said demodulation at the difference between the pilot frequency and the modulation frequency that is free from the phase noise and drift caused by the local oscillators.

The present invention further provides a corresponding method and the receiver portion of said communication system.

Additional features and the theory of operation of the present invention are described in relation to the description of the preferred embodiment.

DESCRIPTION OF THE PREFERRED EMBODIMENT

Figure 1:
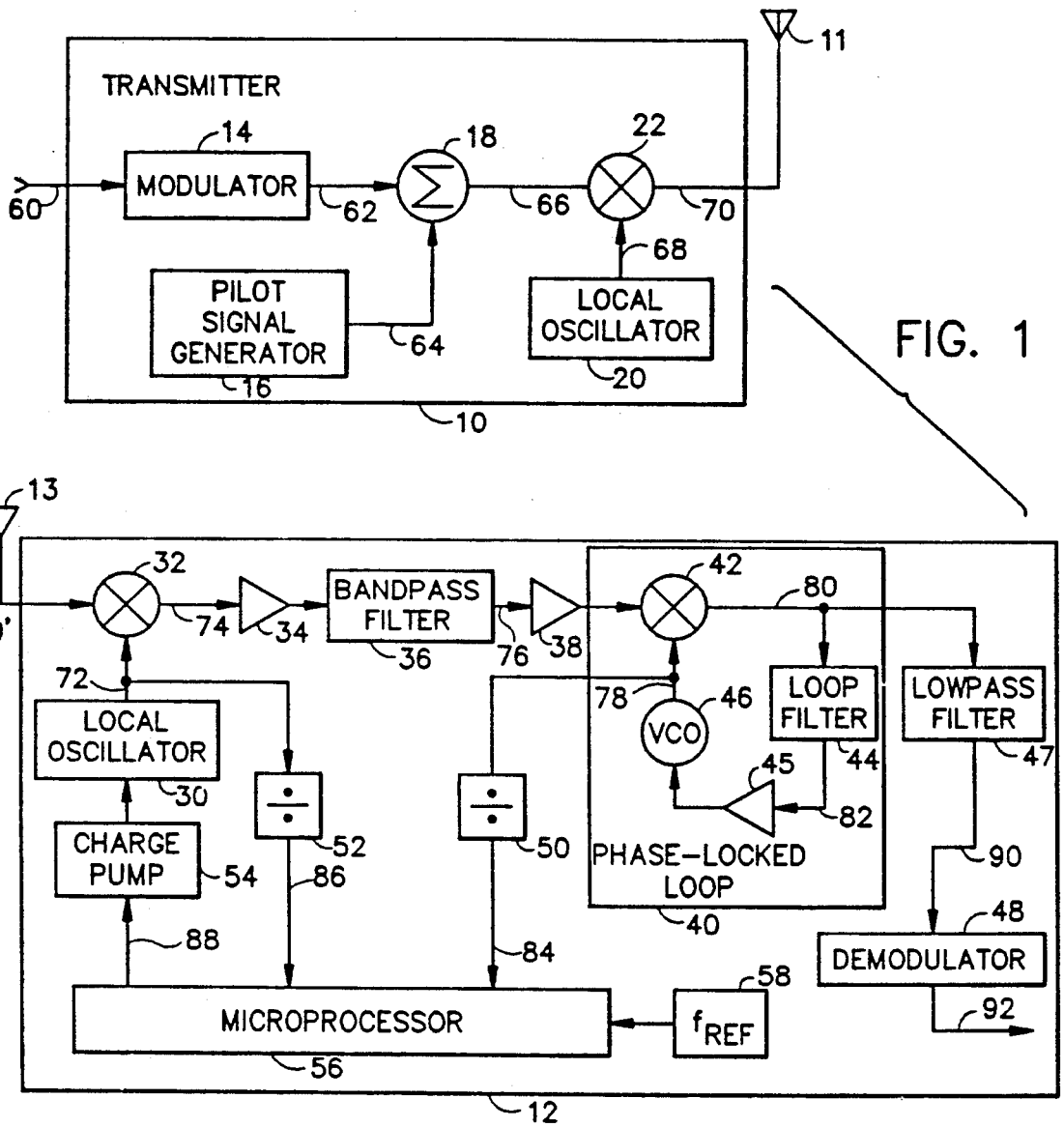
FIG. 1 is a block diagram of a preferred embodiment of a communication system according to the present invention.

Referring to FIG. 1, a preferred embodiment of the communication system of the present invention includes a transmitter 10, a transmitting antenna 11, a receiver 12, and a receiving antenna 13. The transmitter 10 includes a modulator 14, a pilot signal generator 16, a summation unit 18, a local oscillator 20 and a mixer 22. The receiver 12 includes a local voltage controlled oscillator (VCO) 30, a first mixer 32, a first amplifier 34, a bandpass filter 36, a second amplifier 38, a phase-locked loop 40, which includes a second mixer 42, a narrow band loop filter 44, a third amplifier 45 and a VCO 46, a lowpass filter 47, a demodulator 48, a first frequency divider 50, a second frequency divider 52, a charge pump 54 and a microprocessor 56 and a reference frequency ($f_{REF}$) source 58.

In the transmitter 10, a baseband information signal 60 is frequency modulated by the modulator 14 to provide a frequency modulated information signal 62 at an instantaneous modulation frequency of $f_M$. The pilot signal generator 16 generates a pilot signal 64 at a pilot frequency $f_P$. The summation unit 18 linearly adds the pilot signal 64 to the frequency modulated information signal 62 to provide a combined signal 66. The local oscillator 20 provides a first RF signal 68 at a carrier frequency $f_C$. The mixer 22 mixes the first RF signal 68 with the combined signal 66 to provide an upconverted signal 70 for transmission. The upconverted signal 70 includes both an information component at a frequency $f_C+f_M$ and a pilot frequency component at a frequency $f_C+f_P$.

The upconverted signal 70 is broadcast from the transmitting antenna 11 and received by the receiving antenna 13 as a received upconverted signal 70'.

In the receiver 12, the local oscillator 30 provides a local RF signal 72 at a frequency $f=f_C-f_O$, wherein $f_O$ is an intermediate frequency. The first mixer 32 mixes the local RF signal 72 with the received upconverted signal 70' to provide a downconverted signal 74 at the intermediate frequency $f_O$. The downconverted signal 74 is amplified by the first amplifier 34 and filtered by the bandpass filter 36 to provide a filtered downconverted signal 76. The bandpass filter 36 limits the downconverted signal 76 to a frequency range that includes the pilot frequency component $f_O+f_P$ of the downconverted signal 74 at the upper limit of said frequency range in order to avoid noise. For example, in one preferred embodiment, the pilot frequency component of the downconverted signal 74 is at 612 MHz and the frequency range of the passband of the bandpass filter 36 is from 588 MHz. to 612 MHz. In such preferred embodiment the information component $f_O+f_M$ of the downconverted signal 74 is centered about a frequency of 605.2 MHz. The filtered signal 76 is amplified by the second amplifier 38 and provided to the phase-locked loop 40.

In the phase-locked loop 40, the VCO 46 provides a signal 78 at a frequency equal to the sum of the intermediate frequency $f_O$ and the pilot signal frequency $f_P$. The second mixer 42 mixes the signal 78 with the amplified filtered downconverted signal from the second amplifier 38 to provide a mixed signal 80 having several components, including among others a pilot component, now at zero frequency (DC), and a downconverted component at the difference of the pilot frequency and the modulation frequency $f_P-f_M$. The mixed signal 80 is filtered by the loop filter 44 to extract the pilot component 82 (which is equal to DC in the locked condition), and to provide a very narrow phase-lock acquisition range of $f_O+f_P\pm f_A$. The pilot frequency component 82 is amplified by the third amplifier 45 and provided to the VCO 46 which tracks the pilot frequency component of the downconverted signal 76 to provide the signal 78 at the sum of the intermediate frequency and the pilot frequency $f_O+f_P$.

The frequency $f_O+f_P$ of the sum signal 78 is controlled by the means of a frequency-locked loop, which includes the microprocessor 56, the first frequency divider 50, the second frequency divider 52, the charge pump 54 and the voltage controlled local oscillator 30.

The frequency f of the local oscillator 30 is adjusted by the frequency-locked loop so that the frequency of the sum signal $f_O+f_P$ is tuned to the desired value in the upper frequency range of the band pass filter 36, i.e. at 612 MHz in this example.

The first frequency divider 50 and the second frequency divider 52 respectively divide the output signal 78 of the VCO 46 and the output signal 72 of the VCO local oscillator 30, to provide respective signals 84 and 86 at proportionally lower frequencies, suitable for measurements by the microprocessor 56.

The microprocessor 56 measures the frequency of the signal 84 by comparing it to its own frequency reference $f_{REF}$, which is provided by the frequency source 58 and stored in the microprocessor memory. The microprocessor 56 then compares the measured frequency value of the signal 84 with the desired frequency value $f_{REF}$ stored in the microprocessor memory, and calculates the amount of frequency error in the signal 84. Next, the microprocessor 56 measures the frequency of the signal 86, and based on the calculated frequency error in the signal 84, the microprocessor 56 calculates the amount of the charge that must be delivered to the charge pump circuit 54 in order to adjust the frequency of the local oscillator 30 to a new value that will yield zero frequency error in the sum signal 78 from which the signal 84 is derived. This action of the frequency-locked loop ensures that the frequency $f_O+f_P$ of the sum signal 78 is maintained at the desired frequency.

Figure 2A:
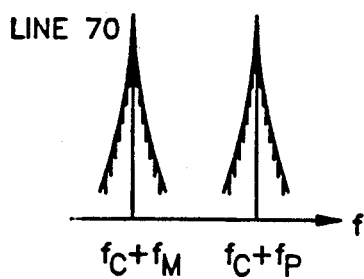
FIG. 2A shows the frequency spectrum of the upconverted signal transmitted by the transmitter in the system of FIG. 1.

Imperfections in the local oscillator 20 in the transmitter 10 cause the components of the upconverted signal 70 to include phase noise and drift, as illustrated by the frequency spectrum of this signal in FIG. 2A showing the information component at the frequency $f_C+f_M$ and the pilot frequency component at the frequency $f_C+f_P$.

Figure 2B:
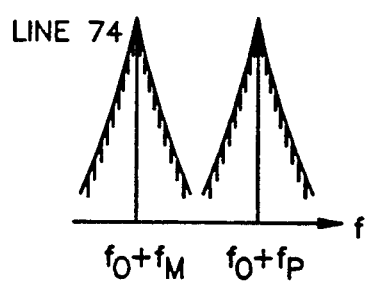
FIG. 2B shows the frequency spectrum of the downconverted signal provided by the receiver in the system of FIG. 1.
Figure 2C:
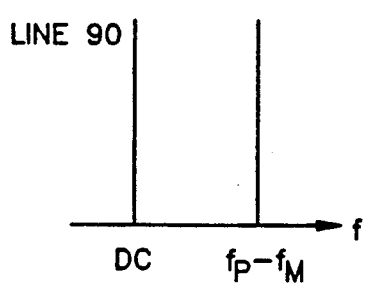
FIG. 2C shows the frequency spectrum of the phase noise and drift free component that is provided to the demodulator in the receiver in the system of FIG. 1.

Imperfections in the local oscillator 30 in the receiver 12 cause the components of the downconverted signal 74 to include even more phase noise and drift, as illustrated by the frequency spectrum of this signal in FIG. 2B showing the information component at the frequency $f_O+f_M$ and the pilot frequency component at the frequency $f_O+f_P$.

The downconverted signal 74 can be expressed as $$S_B(t) = \cos[(\omega_O+\omega_P)t + N_1\phi(t)] + \cos[(\omega_O+\omega_M)t + N_2\phi(t)] \quad \{Eq. 1\}$$

wherein the term $N\phi(t)$ represents the combined phase noise contributed by both of the local oscillators 20, 30 to each of the components of the downconverted signal 74.

Because both the information component and the pilot frequency component are modulated by RF signals provided by the same local oscillators 20, 30, $$N\phi(t) = N_1\phi(t) = N_2\phi(t) \quad \{Eq. 2\}$$

The signal 78 at the frequency $f_O+f_P$ can be expressed as $$S_R(t) = \cos[(\omega_O+\omega_P)t + N'\phi(t) + \theta] \quad \{Eq. 3\}$$

wherein $N'\phi(t)$ equals $N\phi(t)$ only within the acquisition range of the phase-locked loop 40 and $\theta$ is a ninety degree phase shift introduced by the VCO 46.

The mixed signal 80 can be expressed as the product of Equations 1 and 3:

$$S_C(t) = S_B(t) \times S_F(t) \quad \{Eq. 4\}$$
$$= \cos[N\phi(t) - N\phi(t) + \theta] +$$
$$\cos[(\omega_P - \omega_M)t + N\phi(t) - N\phi(t) + \theta] +$$

(higher harmonic components)

Within the acquisition range $f_O - f_P \pm f_A$ of the phase-locked loop 40, Equation 4 may be simplified to express the difference component of the mixed signal 80 at the frequency $f = f_P - f_M$ as $$S_C(t) = \cos\theta + \cos[(\omega_P - \omega_M)t + \theta] \quad \{Eq. 5\}$$

Since $\theta = 90$ degrees, $$S_C(t) = \sin(\omega_P - \omega_M)t \quad \{Eq. 6\}$$

Equation 6 shows that the difference frequency component at the frequency $f = f_P - f_M$ is free of phase noise and drift.

The lowpass filter 47 filters the mixed signal 80 from the second mixer 42 to provide the phase noise and drift free component 90 at the difference frequency $f_P - f_M$. The demodulator 48 demodulates the difference component 90 to provide the information signal 92 at the baseband frequency.

A single pilot signal frequency can be added to a plurality of different frequency modulated information signals that are modulated about different subcarriers in an upconverted signal.

Between the transmitter and the receiver of FIG. 1, a number of additional up, or down, conversions can take place without any effect to the phase noise cancellation efficiency of this invention.

The present invention is particularly suited for satellite communications wherein the available frequency bands include additional space for including a pilot frequency component in an upconverted signal in contrast to terrestrial communication systems.

In an alternative preferred embodiment, the communication system of FIG. 1 can be utilized for an information signal that is phase modulated instead of frequency modulated, as described above with reference to FIG. 1, without any loss of performance and with the same benefits as when the information signal is frequency modulated.

We claim:

1. A communication system, comprising a transmitter including a modulator for frequency or phase modulating a baseband information signal at a modulation frequency, a first local oscillator for providing a first RF signal at a carrier frequency, and a first mixer for mixing the modulated information signal with the first RF signal to provide an upconverted signal for transmission; and a receiver including a second local oscillator for providing a local RF signal at a frequency equal to the difference between the carrier frequency and an intermediate frequency, a second mixer for mixing the upconverted signal received from the transmitter with the local RF signal to provide a downconverted signal at the intermediate frequency, and a demodulator for demodulating the downconverted signal to provide the information signal at the baseband frequency, wherein the downconverted signal includes phase noise and drift caused by imperfections in said local oscillators;

wherein the transmitter further includes means for adding a pilot frequency component to the modulated information signal in the transmitter prior to mixing the modulated information signal with the first RF signal, whereby the upconverted signal and the downconverted signal each includes a pilot frequency component; and wherein the receiver further includes a phase-locked loop for providing a signal at a frequency equal to the sum of the intermediate frequency and the pilot frequency by tracking the pilot frequency component of the downconverted signal; and means for frequency locking the second local oscillator so that the sum signal provided by the phase-locked loop is adjusted to a desired frequency;

wherein the phase-locked loop includes a third mixer for mixing said sum signal provided by the phase locked loop with the downconverted signal to thereby provide a downconverted component for said demodulation at the difference between the pilot frequency and the modulation frequency that is free from the phase noise and drift caused by the local oscillators.

2. A communication system according to claim 1, wherein the receiver further includes a bandpass filter between the second local oscillator and the mixing means of the phase-locked loop for bandpass limiting the downconverted signal to a frequency range that includes the pilot frequency of the downconverted signal at the upper limit of said frequency range.

3. A receiver for receiving an upconverted signal provided by a transmitter that includes a modulator for frequency or phase modulating a baseband information signal at a modulation frequency, a first local oscillator for providing a first RF signal at a carrier frequency, a first mixer for mixing the modulated information signal with the first RF signal to provide an upconverted signal for transmission, and means for adding a pilot frequency component to the modulated information signal in the transmitter prior to mixing the modulated information signal with the first RF signal, whereby the upconverted signal includes a pilot frequency component, the receiver comprising a second local oscillator for providing a local RF signal at a frequency equal to the difference between the carrier frequency and an intermediate frequency, a second mixer for mixing the upconverted signal received from the transmitter with the local RF signal to provide a downconverted signal at the intermediate frequency, whereby the downconverted signal includes a pilot frequency component; and a demodulator for demodulating the downconverted signal to provide the information signal at the baseband frequency, wherein the downconverted signal includes phase noise and drift caused by imperfections in said local oscillators;

a phase-locked loop for providing a signal at a frequency equal to the sum of the intermediate frequency and the pilot frequency by tracking the pilot frequency component of the downconverted signal; and means for frequency locking the second local oscillator so that the sum signal provided by the phase-locked loop is adjusted to a desired frequency;
wherein the phase-locked loop includes a third mixer for mixing said difference signal provided by the phase locked loop with the downconverted signal to thereby a provide a downconverted component for said demodulation at the difference between the pilot frequency and the modulation frequency that is free from the phase noise and drift caused by the local oscillators.

4. A communication system according to claim 3, wherein the receiver further includes
a bandpass filter between the second local oscillator and the mixing means of the phase-locked loop for bandpass limiting the downconverted signal to a frequency range that includes the pilot frequency of the downconverted signal at the upper limit of said frequency range.

5. A communication method, comprising the steps of
(a) frequency or phase modulating a baseband information signal at a modulation frequency;
(b) providing a first RF signal at a carrier frequency by using a first local oscillator in a transmitter;
(c) mixing the modulated information signal with the first RF signal to provide an upconverted signal for transmission by the transmitter;
(d) providing a local RF signal at a frequency equal to the difference between the carrier frequency and an intermediate frequency by using a second local oscillator in a receiver;
(e) mixing the upconverted signal received from the transmitter with the local RF signal to provide a downconverted signal at the intermediate frequency, wherein the downconverted signal includes phase noise and drift caused by imperfections in said local oscillators;
(f) demodulating the downconverted signal to provide the information signal at the baseband frequency;
(g) adding a pilot frequency component to the modulated information signal in the transmitter prior to mixing the modulated information signal with the first RF signal, whereby the upconverted signal and the downconverted signal each includes a pilot frequency component;
(h) providing a signal at a frequency equal to the sum of the intermediate frequency and the pilot frequency by tracking the pilot frequency component of the downconverted signal by using a phase-locked loop;
(i) frequency locking the second local oscillator so that the sum signal provided by the phase-locked loop is adjusted to a desired frequency; and
(j) mixing said sum signal provided by the phase locked loop with the downconverted signal to thereby a provide a downconverted component for said demodulation at the difference between the pilot frequency and the modulation frequency that is free from the phase noise and drift caused by the local oscillators.

6. A method according to claim 5, further comprising the step of
(k) prior to step (j), bandpass limiting the downconverted signal to a frequency range that includes the pilot frequency of the downconverted signal at the upper limit of said frequency range.

* * * * *